(12) United States Patent
Chyan et al.

(10) Patent No.: US 8,203,136 B2
(45) Date of Patent: Jun. 19, 2012

(54) EPITAXIAL SUBSTRATE, SEMICONDUCTOR LIGHT-EMITTING DEVICE USING SUCH EPITAXIAL SUBSTRATE AND FABRICATION THEREOF

(75) Inventors: Jiunn-Yih Chyan, Hsinchu (TW); Hung-Chi Chien, Hsinchu (TW); Kun-Lin Yang, Hsinchu (TW); Wen-Ching Hsu, Hsinchu (TW)

(73) Assignee: Sino-American Silicon Products Inc., Hsinchu (TW)

( * ) Notice: Subject to any disclaimer, the term of this patent is extended or adjusted under 35 U.S.C. 154(b) by 0 days.

(21) Appl. No.: 13/024,226

(22) Filed: Feb. 9, 2011

(65) Prior Publication Data

US 2012/0112158 A1    May 10, 2012

(30) Foreign Application Priority Data

Nov. 5, 2010 (TW) .................... 99138094 A

(51) Int. Cl.
*H01L 29/06* (2006.01)
(52) U.S. Cl. ............................ 257/9; 977/811
(58) Field of Classification Search ....... 257/9; 977/811
See application file for complete search history.

(56) References Cited

U.S. PATENT DOCUMENTS

| | | | |
|---|---|---|---|
| 2005/0112048 A1* | 5/2005 | Tsakalakos et al. | 423/439 |
| 2009/0194160 A1* | 8/2009 | Chin et al. | 136/256 |
| 2010/0051903 A1* | 3/2010 | Cho | 257/14 |

* cited by examiner

Primary Examiner — Douglas Menz

(57) ABSTRACT

The invention provides an epitaxial substrate, a semiconductor light-emitting device using such epitaxial substrate and fabrication thereof. The epitaxial substrate according to the invention includes a crystalline substrate. In particular, a crystal surface of the crystalline substrate thereon has a plurality of randomly arranged nanorods. The plurality of nanorods is formed of oxide of a material different from that forms the crystalline substrate.

3 Claims, 4 Drawing Sheets

Figure 1:
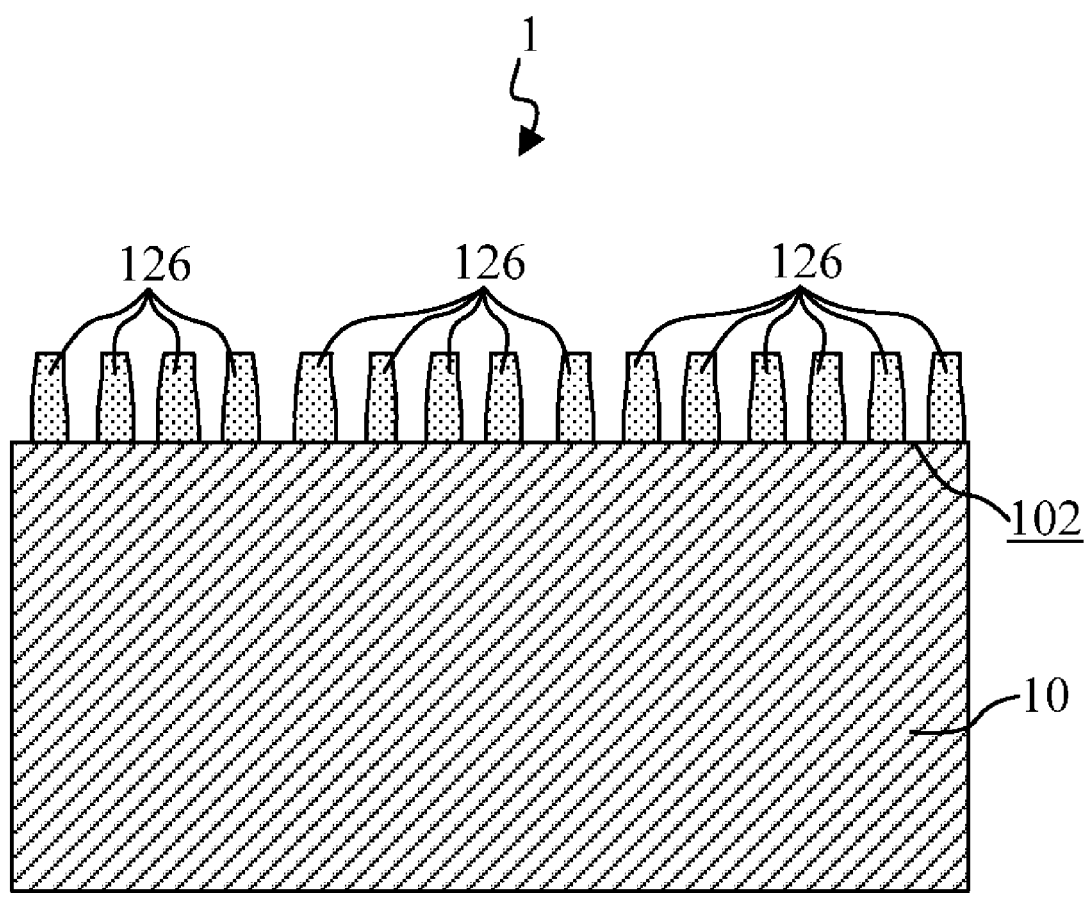

| etching solution | composition (mol.%) | | |
|---|---|---|---|
| | solvent[1] | HF | oxidizer[2] |
| Secco | 67.6 | 32.2 | 0.17 |
| Sirtl | 71.2 | 26.3 | 2.5 |
| Wright | 78.5 | 16.1 | 5.4 |
| Seiter | 78.5 | 5.9 | 15.6 |
| [1] $H_2O + CH_3COOH(H_{Ac})$;  [2] $CrO_3 + HNO_3$ | | | |

FIG. 3

EPITAXIAL SUBSTRATE, SEMICONDUCTOR LIGHT-EMITTING DEVICE USING SUCH EPITAXIAL SUBSTRATE AND FABRICATION THEREOF

CROSS-REFERENCE TO RELATED APPLICATION

This utility application claims priority to Taiwan Application Serial Number 099138094, filed Nov. 5, 2010, which is incorporated herein by reference.

BACKGROUND OF THE INVENTION

1. Field of the Invention

The invention relates to an epitaxial substrate, a semiconductor light-emitting device using such epitaxial substrate and fabrication thereof, and more in particular, to an epitaxial substrate having hetero-nanorod, a semiconductor light-emitting device using such epitaxial substrate and fabrication thereof.

2. Description of the Prior Art

The compound semiconductor materials, such as GaN, AlGaN, AlInGaN, and other III-V group compounds, or CdTe, ZnO, ZnS, and other II-VI group compounds, have been used for a wide variety of substrates of microelectronic devices including transistors, field emission devices, and optoelectronic devices, but not limiting the above described.

Taking GaN-based microelectronic devices as an example, a major problem in manufacture is that the GaN semiconductor layer manufactured must have low defect density to ensure the performance of GaN-based microelectronic devices. It is understood that one of these contributors for defects is the lattice mismatch between the substrate and the GaN layers grown on the substrate. So, though the GaN layer has been grown on the sapphire substrate, but it is well known that the GaN layer is preferably grown on the AlN buffer layer previously formed on the SiC substrate to reduce the defect density, especially to reduce the density of threading dislocations. Though there are these considerable progresses, it is still the goal wanted to reach to reduce the defect density continuously on the research.

It is also well-known that the condition of epitaxy is controlled to achieve the lateral epitaxy by use of the substrate with patterned surface, which benefits in preferred orientation of epitaxy, to reduce the defect density or control defects. For example, a GaN semiconductor layer can be formed on the sapphire substrate with patterned surface in lateral epitaxial way to control dislocations in extending laterally to reduce the density of threading dislocations.

However, the prior arts regarding manufacture of the epitaxial substrate with patterned surface all utilize a photolithography process. Obviously, the prior arts regarding manufacture of the epitaxial substrate with patterned surface have high manufacture cost and slow production speed.

SUMMARY OF THE INVENTION

Accordingly, one scope of the invention is to provide an epitaxial substrate and fabrication thereof. In particular, the epitaxial substrate according to the invention doesn't have patterned surface, but has the function of benefiting the compound semiconductor material in lateral epitaxy, too, to grow epitaxial layers with excellent quality. And the manufacturing method according to the invention has advantages of low manufacture cost and quick production speed.

Another scope of the invention is to provide a semiconductor light-emitting device using the epitaxial substrate according to the invention and fabrication thereof. Thereby, the semiconductor light-emitting device according to the invention has excellent optical performance.

An epitaxial substrate according to an embodiment of the invention includes a crystalline substrate. The crystalline substrate is formed of a first material, and has a crystal surface. In particular, a plurality of nanorods are randomly arranged on the crystal surface of the crystalline substrate. The plurality of nanorods are formed of an oxide of a second material different from the first material.

A method of fabricating an epitaxial substrate, according to an embodiment of the invention, is first to prepare a crystalline substrate. The crystalline substrate is formed of a first material, and has a crystal surface. Then, the method according to the invention is to deposit a poly-crystalline material layer of a second material on the crystal surface of the crystalline substrate. In particular, the second material is different from the first material. Next, the method according to the invention is to etch the grain boundaries of the poly-crystalline material layer by an etching process to obtain a plurality of nanorods of the second material. Finally, the method according to the invention is to perform an oxidization process, such that the plurality of nanorods of the second material are transferred into the plurality of nanorods of an oxide of the second material, to obtain the epitaxial substrate.

In practical applications, the first material forming the crystalline substrate can be sapphire, SiC, GaN, GaAs, ZnO, Si, $ScAlMgO_4$, $SrCu_2O_2$, YSZ (Yttria-Stabilized Zirconia), $LiAlO_2$ (Lithium Aluminum Oxide), $LiGaO_2$ (Lithium Gallium Oxide), $Li_2SiO_3$ (Lithium Silicon Oxide), $LiGeO_3$ (Lithium Germanium Oxide), $NaAlO_2$ (Sodium Aluminum Oxide), $NaGaO_2$ (Sodium Gallium Oxide), $Na_2GeO_3$ (Sodium Germanium Oxide), $Na_2SiO_3$ (Sodium Silicon Oxide), $Li_3PO_4$ (Lithium Phosphor Oxide), $Li_3AsO_4$ (Lithium Arsenic Oxide), $Li_3VO_4$ (Lithium Vanadium Oxide), $Li_2MgGeO_4$ ($Li_2MgGeO_4$), $Li_2ZnGeO_4$ (Lithium Zinc Germanium Oxide), $Li_2CdGeO_4$ (Lithium Cadmium Germanium Oxide), $Li_2MgSiO_4$ (Lithium Magnesium Silicon Oxide), $Li_2ZnSiO_4$ (Lithium Zinc Silicon Oxide), $Li_2CdSiO_4$ (Lithium Cadmium Silicon Oxide), $Na_2MgGeO_4$ (Sodium Magnesium Germanium Oxide), $Na_2ZnGeO_4$ (Sodium Zinc Germanium Oxide), $Na_2ZnSiO_4$ (Sodium Zinc Silicon Oxide), and other commercial materials provided for epitaxy.

In practical applications, the second material forming the poly-crystalline material layer can be Ge, ZnO, ZnS, CdSe, CdTe, CdS, ZnSe, InAs, InP, Si or metal/silicide where the metal can be Al, Ni, Fe, etc, and the silicide can be SiAl, SiZn, SiNi, etc.

In one embodiment, the surface of epitaxial substrate has an average surface roughness (Ra) in a range from 0.1 nm to 100 nm.

In one embodiment, the surface of epitaxial substrate has a mean peak-to-valley height (Rz) in a range from 9 nm to 999 nm.

In one embodiment, the poly-crystalline material layer can be deposited on the crystal surface of the crystalline substrate by an LPCVD (low pressure chemical vapor deposition) process, a PECVD (plasma enhanced chemical vapor deposition) process, a sputtering process, or a thermal evaporation process.

In one embodiment, the poly-crystalline material layer 12 has a thickness in a range from 20 nm to 2000 nm.

A semiconductor light-emitting device according to an embodiment of the invention includes a crystalline substrate, a plurality of nanorods, and a light-emitting structure constituted by a plurality of semiconductor layers. The crystalline substrate is formed of a first material, and has a crystal surface. The plurality of nanorods are formed of an oxide of the second material, and are randomly arranged on the crystal surface of the crystalline substrate. In particular, the second material is different from the first material. The light-emitting structure is formed on the crystal surface and the plurality of nanorods. A bottom-most layer of the plurality of semiconductor layers is an epitaxial layer of a compound semiconductor material. The plurality of nanorods benefit the compound semiconductor material in epitaxy.

A method of fabricating a semiconductor light-emitting device, according to an embodiment of the invention, is first to prepare a crystalline substrate. The crystalline substrate is formed of a first material, and has a crystal surface. Then, the method according to the invention is to deposit a poly-crystalline material layer of a second material. In particular, the second material is different from the first material. Next, the method according to the invention is to etch the grain boundaries of the poly-crystalline material layer by an etching process to obtain a plurality of nanorods of the second material. Then, the method according to the invention is to perform an oxidization process such that the plurality of nanorods of the second material are transferred into the plurality of nanorods of an oxide of the second material. Finally, the method according to the invention is to form a plurality of semiconductor layers to constitute a light-emitting structure on the crystal surface and the plurality of nanorods. A bottom-most layer of the plurality of semiconductor layers is an epitaxial layer of a compound semiconductor material. The plurality of nanorods benefit the compound semiconductor material in epitaxy.

Compared to the prior art, the epitaxial substrate according to the invention includes hetero-nanorods, doesn't have patterned surfaces, and still benefits the compound semiconductor material in growing epitaxial layers with excellent quality. Moreover, the method according to the invention has advantages of low manufacture cost and quick production speed. The method according to the invention also has the excellent optoelectronic performance.

The advantage and spirit of the invention may be understood by the following recitations together with the appended drawings.

BRIEF DESCRIPTION OF THE APPENDED DRAWINGS

FIG. 1 illustratively shows an epitaxial substrate according to a preferred embodiment of the invention.

Figure 2A:
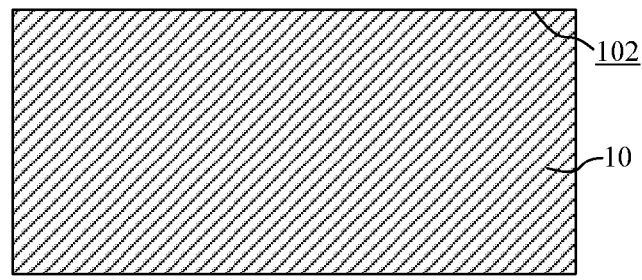
Figure 2B:
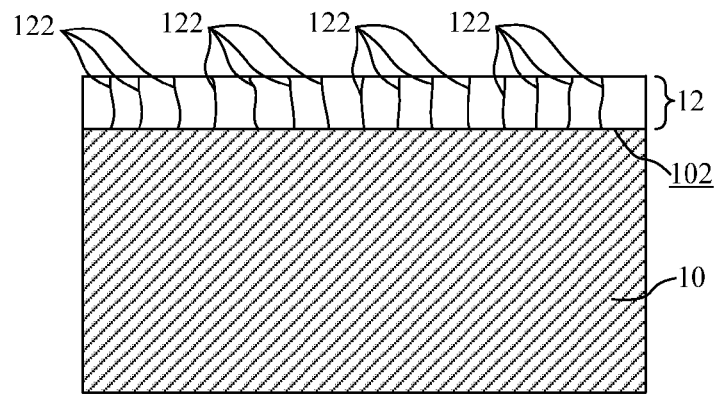
Figure 2C:
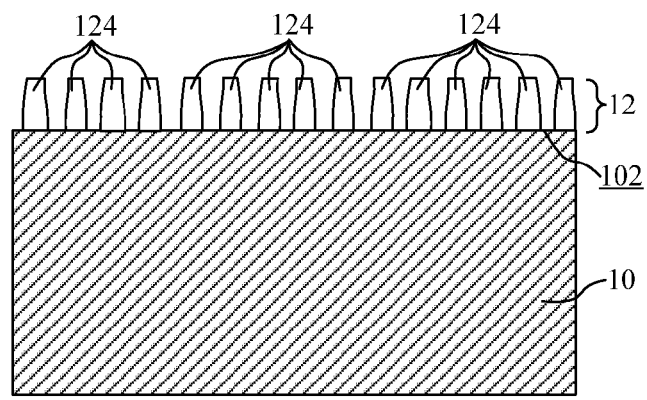

FIGS. 2A through 2C illustratively show a method according to a preferred embodiment of the invention to fabricate the epitaxial substrate, for example, as shown in FIG. 1.

FIG. 3 shows a list of some etching solutions and the compositions thereof which can be used to etch the grain boundary of the poly-crystalline material layer shown in FIG. 2.

Figure 4:
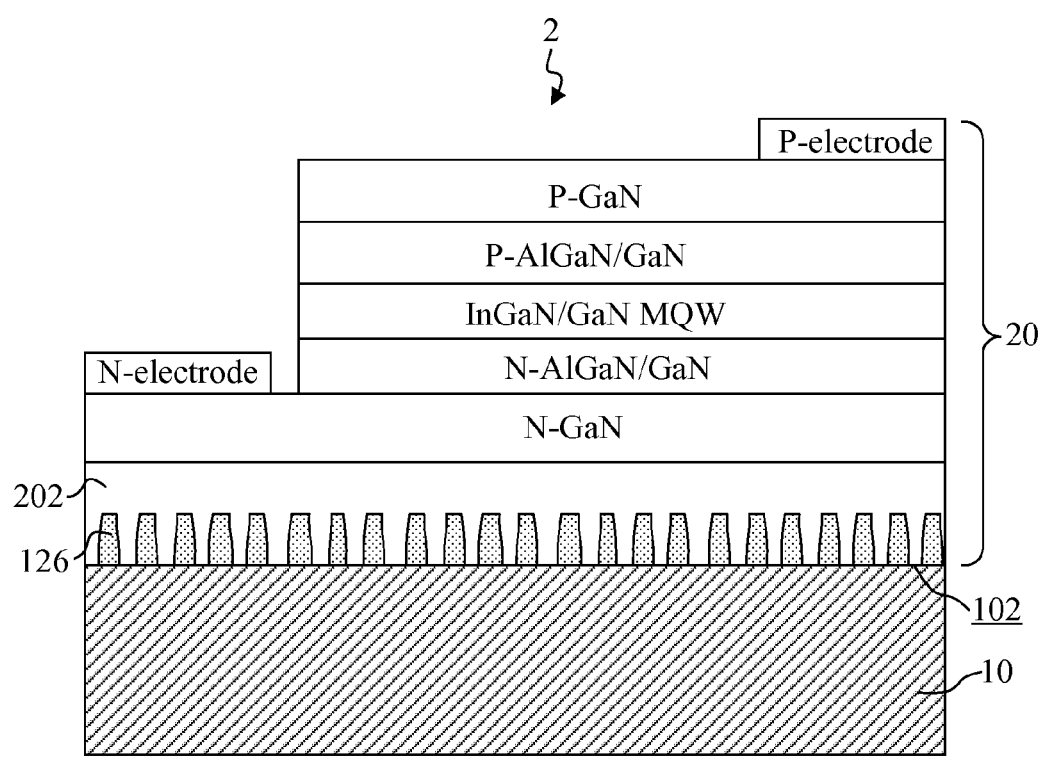

FIG. 4 illustratively shows a semiconductor light-emitting device according to a preferred embodiment of the invention.

DETAILED DESCRIPTION OF THE INVENTION

Referring to FIG. 1, FIG. 1 is a cross-sectional view of an epitaxial substrate 1 according to a preferred embodiment of the invention. The epitaxial substrate 1 is provided for a compound semiconductor material in epitaxy such as GaN, AlGaN, AlInGaN, and other III-V group compounds, or CdTe, ZnO, ZnS, and other II-VI group compounds.

As shown in FIG. 1, the epitaxial substrate 1 according to the invention includes a crystalline substrate 10. The crystalline substrate 10 has a crystal surface 102.

In particular, a plurality of nanorods 126 are randomly arranged on the crystal surface 102 of the crystalline substrate 10. The plurality of nanorods is formed of an oxide of a second material different from the first material. It is noted that the surface of epitaxial substrate 1 according to the invention is a nanoscale rough surface and not a patterned surface. And, the plurality of nanorods 126 formed of the oxide of the second material have non-fixed lattice constant, and so can be considered as amorphous.

In practical applications, the first material forming the crystalline substrate 10 can be sapphire, SiC, GaN, GaAs, ZnO, Si, ScAlMgO$_4$, SrCu$_2$O$_2$, YSZ (Yttria-Stabilized Zirconia), LiAlO$_2$, LiGaO$_2$, Li$_2$SiO$_3$, LiGeO$_3$, NaAlO$_2$, NaGaO$_2$, Na$_2$GeO$_3$, Na$_2$SiO$_3$, Li$_3$PO$_4$, Li$_3$AsO$_4$, Li$_3$VO$_4$, Li$_2$MgGeO$_4$, Li$_2$ZnGeO$_4$, Li$_2$CdGeO$_4$, Li$_2$MgSiO$_4$, Li$_2$ZnSiO$_4$, Li$_2$CdSiO$_4$, Na$_2$MgGeO$_4$, Na$_2$ZnGeO$_4$, Na$_2$ZnSiO$_4$, and other commercial materials provided for epitaxy.

In practical applications, the second material can be Ge, ZnO, ZnS, CdSe, CdTe, CdS, ZnSe, InAs, InP, Si or metal/silicide where the metal can be Al, Ni, Fe, etc, and the silicide can be SiAl, SiZn, SiNi, etc.

In one embodiment, the surface of epitaxial substrate 1 has an average surface roughness (Ra) in a range from 0.1 nm to 100 nm.

In one embodiment, the surface of epitaxial substrate 1 has a mean peak-to-valley height (Rz) in a range from 9 nm to 999 nm.

Referring to FIGS. 2A through 2C and FIG. 1, these figures of sectional views illustratively show a method according to a preferred embodiment of the invention to fabricate the epitaxial substrate 1, for example, as shown in FIG. 1.

As shown in FIG. 2A, the method according to the invention is first to prepare a crystalline substrate 10. The crystalline substrate 10 is formed of a first material, and has a crystal surface 102.

Then, the method according to the invention is to deposit a poly-crystalline material layer 12 of a second material on the crystal surface 102 of the crystalline substrate 10, as shown in FIG. 2B. Also as shown in FIG. 2B, the poly-crystalline material layer 12 has grain boundaries 122. In particular, the second material is different from the first material. The compositions relating to the first material and the second material have been described in details above, and will not be described again here.

Next, the method according to the invention is to etch the grain boundaries 122 of the poly-crystalline material layer 12 by an etching process to obtain a plurality of nanorods 124 of the second material. The cross-sectional view of the poly-crystalline material layer 12 after being etched is schematically shown in FIG. 2C.

Finally, the method according to the invention is to perform an oxidization process, such that the plurality of nanorods 124 of the second material are transferred into the plurality of nanorods 126 of an oxide of the second material, to obtain the epitaxial substrate 1, for example, as shown in FIG. 1. For example, a structure as shown in FIG. 2C is placed in a furnace charged with oxygen at 1100° C. to perform the oxidization process such that the plurality of nanorods 124 of the second material are transferred into the plurality of nanorods 126 of the oxide of the second material.

It is noted that the surface of epitaxial substrate 1 according to the invention is a nanoscale rough surface and not a patterned surface.

In one embodiment, the poly-crystalline material layer 12 can be deposited on the crystal surface 102 of the crystalline substrate 10 by an LPCVD process, a PECVD process, a sputtering process, or a thermal evaporation process.

In practical applications, Ra and Rz values regarding the surface of the epitaxial substrate 1 according to the invention are controlled by controlling the thickness of the poly-crystalline material layer 12, grain size, etching conditions, etc.

In one embodiment, the poly-crystalline material layer 12 has a thickness in a range from 20 nm to 2000 nm.

In a case, taking a sapphire as the substrate, various etching solutions, which can be used to etch the grain boundary 122 of poly-crystalline material layer 12, and the compositions of these etching solutions are listed in FIG. 3. FIG. 3 lists four etching solutions including Secco solution, Sirtl solution, Wright solution, and Seiter solution. In addition, because the etching solutions listed in FIG. 3 cannot etch the sapphire substrate, these etching solutions can etch the grain boundary 122 of the polycrystalline layer 12 until the crystal surface 102 of the sapphire substrate is exposed.

Compared to the prior art, the surface of epitaxial substrate 1 according to the invention is a nanoscale rough surface, and not a patterned surface. More particularly, the surface of epitaxial substrate 1 according to the invention includes hetero-nanorods. It is noted that the epitaxial substrate 1 according to the invention, similar to the epitaxial substrate having patterned surfaces of the prior art, has the function of benefiting the compound semiconductor material in lateral epitaxy, too.

Referring to FIG. 4, FIG. 4 is a cross-sectional view schematically showing a semiconductor light-emitting device 2 according to a preferred embodiment of the invention. The semiconductor light-emitting device 2, according to the preferred embodiment of the invention, includes a crystalline substrate 10, a plurality of nanorods 126, and a light-emitting structure constituted by a plurality of semiconductor layers 20. The crystalline substrate 10 is formed of a first material, and has a crystal surface 102. The plurality of nanorods 126 are formed of an oxide of the second material, and are randomly arranged on the crystal surface 102 of the crystalline substrate. In particular, the second material is different from the first material. The compositions relating to the first material and the second material have been described in details above, and will not be described again here.

The light-emitting structure is formed on the crystal surface 102 and the plurality of nanorods 126. A bottom-most layer 202 of the plurality of semiconductor layers 20 is an epitaxial layer of a compound semiconductor material. The plurality of nanorods 126 benefit the compound semiconductor material in epitaxy. That is to say that the plurality of nanorods 126 benefit the compound semiconductor material in forming in lateral epitaxy way on the crystal surface 102 of the crystalline substrate 10 to control dislocations in extending laterally to reduce the density of threading dislocations.

Referring to FIG. 1, FIGS. 2A through 2C, and FIG. 4, these figures of sectional views illustratively show a method according to a preferred embodiment of the invention to fabricate the semiconductor light-emitting device 2, for example, as shown in FIG. 4. The method according to the invention is first to prepare a crystalline substrate 10, as shown in FIG. 2A. The crystalline substrate 10 is formed of a first material, and has a crystal surface 102.

Then, the method according to the invention is to deposit a poly-crystalline material layer 12 of a second material on the crystal surface 102 of the crystalline substrate 10, as shown in FIG. 2B. Also as shown in FIG. 2B, the poly-crystalline material layer 12 includes grain boundaries 122. In particular, the second material is different from the first material.

Next, the method according to the invention is to etch the grain boundaries 122 of the poly-crystalline material layer 12 by an etching process to obtain a plurality of nanorods 124 of the second material. The cross-sectional view of the poly-crystalline material layer 12 after being etched is shown in FIG. 2C.

Afterward, the method according to the invention is to perform an oxidization process such that the plurality of nanorods 124 of the second material are transferred into the plurality of nanorods 126 of an oxide of the second material to obtain the epitaxial substrate 1 shown in FIG. 1. Finally, the method according to the invention is to form a plurality of semiconductor layers 20 to constitute a light-emitting structure on the crystal surface 102 and the plurality of nanorods 126 to finish the semiconductor light-emitting device 2 as shown in FIG. 4.

In particular, a bottom-most layer 202 of the plurality of semiconductor layers 20 is an epitaxial layer of a compound semiconductor material. The plurality of nanorods 126 benefit the compound semiconductor material in epitaxy.

Compared to the prior art, it is noted that the method of fabricating the epitaxial substrate according to the invention is not only without the need of a photolithography process, and but also without the introduction of complicated process. Obviously, the method according to the invention has advantages of low manufacture cost and quick production speed. More particularly, the surface of epitaxial substrate according to the invention includes hetero-nanorods. The semiconductor light-emitting device fabricated by using the epitaxial substrate according to the invention also has the excellent optoelectronic performance.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An epitaxial substrate, comprising:
   a crystalline substrate being formed of a first material and having a crystal surface; and
   a plurality of non-aligned nanorods having non-fixed lattice constant and being formed of an oxide of a second material different from the first material, and randomly arranged on the crystal surface of the crystalline substrate.

2. The epitaxial substrate of claim 1, wherein the first material is one selected from the group consisting of sapphire, SiC, GaN, GaAs, ZnO, Si, ScAlMgO$_4$, SrCu$_2$O$_2$, YSZ (Yttria-Stabilized Zirconia), LiAlO$_2$, LiGaO$_2$, Li$_2$SiO$_3$, LiGeO$_3$, NaAlO$_2$, NaGaO$_2$, Na$_2$GeO$_3$, Na$_2$SiO$_3$, Li$_3$PO$_4$, Li$_3$AsO$_4$, Li$_3$VO$_4$, Li$_2$MgGeO$_4$, Li$_2$ZnGeO$_4$, Li$_2$CdGeO$_4$, Li$_2$MgSiO$_4$, Li$_2$ZnSiO$_4$, Li$_2$CdSiO$_4$, Na$_2$MgGeO$_4$, Na$_2$ZnGeO$_4$, and Na$_2$ZnSiO$_4$, and the second material is one selected from the group consisting of Si, Ge, ZnO, ZnS, CdSe, CdTe, CdS, ZnSe, InAs, InP, and metal/silicide.

3. The epitaxial substrate of claim 1, wherein the surface of epitaxial substrate has an average surface roughness (Ra) in a range from 0.1 nm to 100 nm, and has a mean peak-to-valley height (Rz) in a range from 9 nm to 999 nm.

* * * * *